United States Patent [19]

Couch

[11] 4,431,916

[45] Feb. 14, 1984

[54] OPTICAL DATA BUS RECEIVER WITH SIGNAL WAVEFORM RESTORING MEANS

[75] Inventor: Philip R. Couch, Roanoke, Va.

[73] Assignee: International Telephone and Telegraph Corporation, New York, N.Y.

[21] Appl. No.: 265,311

[22] Filed: May 20, 1981

[51] Int. Cl.³ .................. H01J 40/14; H04B 9/00
[52] U.S. Cl. .................. 250/214 R; 455/619; 307/358; 307/359
[58] Field of Search .................. 307/359, 355; 340/146.3 AC, 146.3 AE, 146.3 AG; 250/214 R; 455/608, 619

[56] References Cited

U.S. PATENT DOCUMENTS 4,257,126  3/1981  Theall, Jr. .................. 455/619

OTHER PUBLICATIONS

Pat O'Neil, "Fiber-optic receiver triggers on edge", Jun. 20, 1979, EDN, pp. 158, 160.

Primary Examiner—David C. Nelms
Assistant Examiner—J. J. Brophy
Attorney, Agent, or Firm—John T. O'Halloran; Peter R. Ruzek

[57] ABSTRACT

An improved high speed optical receiver provides an output that accurately corresponds to the optical input signal without the distorted signals caused by ac or dc coupled receivers when exposed to signals having varying amplitudes. Delaying and dividing circuits permit the creation of threshold signals which eliminate the drawbacks previously encountered.

5 Claims, 5 Drawing Figures

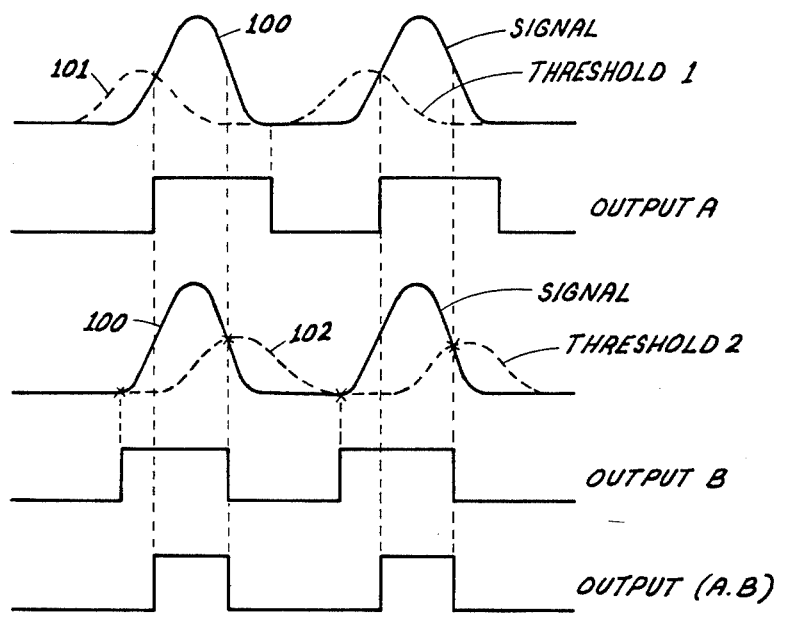
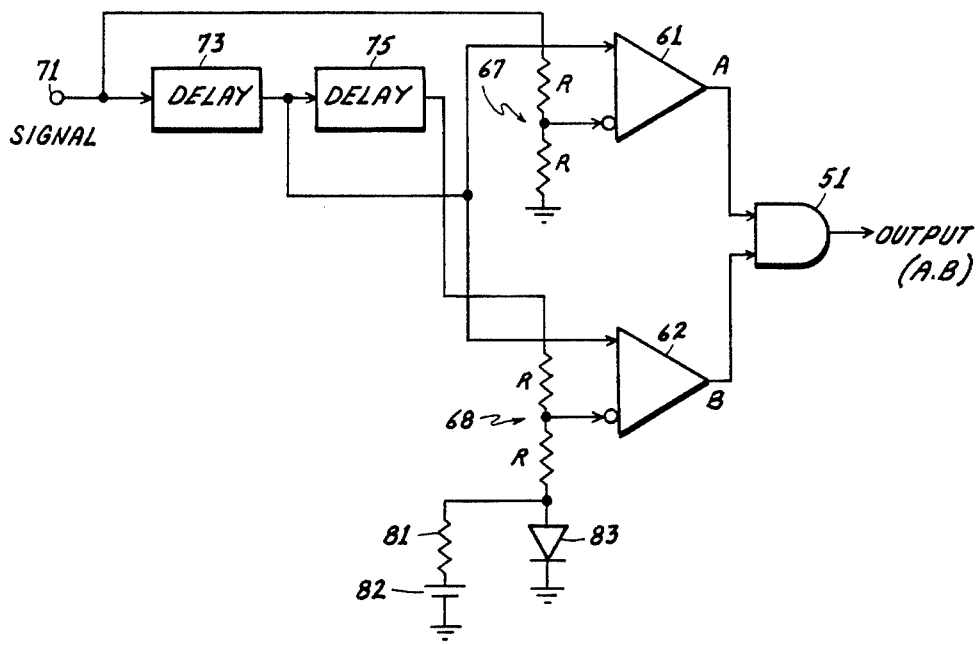

OPTICAL DATA BUS RECEIVER WITH SIGNAL WAVEFORM RESTORING MEANS

FIELD OF THE INVENTION

This invention relates to an optical receiver and more specifically to an optical receiver for use on a high speed fiber optic data bus. The invention will be particularly useful where signals are to be received from several transmitters having different signal levels and where the receiver will be required to adapt quickly to the different signal levels from the several transmitters. The present invention is particularly useful where bit rates exceed 50 megabits per second.

A fiber optic data bus generally includes a mixing section where the signals received from each of a plurality of terminals are interconnected. One such mixer is the so-called Star Coupler. That device accepts all input and output lines and transfers the signal from any input line to all the lines terminating there. Various fiber optic data bus systems are illustrated by U.S. Pat. Nos. 3,883,217 and 3,883,222.

Existing fiber optic data buses operate at low bit rates where adaptive circuitry is used for either adapting to the average signal level or to an instantaneous signal level. These techniques are not useful at high speeds where signal processing in real time is more difficult and where averaging of signal levels wastes a proportionately greater amount of transmission time.

The optical receiver of the present invention does not require adaptive circuitry of the type described above yet the disadvantages of such circuitry have been avoided. A receiver for use in conjunction with a high speed fiber optic data bus is provided.

SUMMARY OF THE INVENTION

The present invention is capable of adapting instantaneously to the signal amplitude, hence no data is lost at the beginning of a transmission. The receiver of the present invention uses a photodetector, a preamplifier and a data decision circuit. A dc coupled amplifier is used in conjunction with signal processing for removing the distortion caused by variations in the signal amplitude. The circuit achieves the desired result by providing separate comparators for the leading and trailing edges of the input waveform with separately derived comparator thresholds. In this manner, the thresholds derived from the data are delayed or advanced with respect to the data and divided, therefore the threshold is made to be optimum regardless of signal amplitude.

BRIEF DESCRIPTION OF THE DRAWING

FIG. 4 shows the waveforms in the device according to the invention.

FIG. 5 is a schematic diagram of one embodiment of the invention.

DETAILED DESCRIPTION OF THE INVENTION

Figure 1:
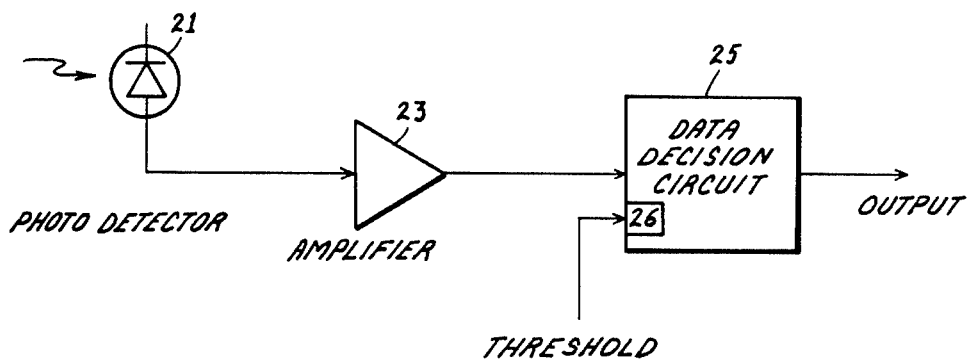
FIG. 1 shows a typical digital optical receiver.

The proposed receiver utilizes a photodetector 21, a preamplifier 23 and a data decision circuit 25 as is shown in FIG. 1. The photodetector 21 provides an output signal representative of the amount of light incident upon the detector. The particular characteristics of the photodetector are not material to the present invention except to the extent that the sensitivity of the photodetector must be sufficient to cause an electrical output upon receipt of any incident optical signal received at the data bus. Additionally, the photodetector must be capable of operating at a high signal rate such as for instance 50 megabits per second. Commercially available photodetectors such as the 5082-4205 manufactured by Hewlett Packard are satisfactory for use in the system of the present invention. The electrical impulse provided by the photodetector is amplified in the amplifier 23 and provided to a data decision circuit 25. The amplifier 23 is provided in order to increase the signal strength of the electrical output of the photodetector. The amplifier is required to be dc coupled with low offset and little pulse distortion over the signal range of amplitude and pulse widths. The decision circuit has a threshold input 26 to which the output of amplifier 23 is compared. The output of the data decision circuit is a digital signal representing the optical signal received by photodetector 21. The data decision circuit has, as its objective, the function of providing an electrical output which is representative of the optical input to the photodetector but which does not include the variations in amplitude between signals from different transmitters.

Figure 2:
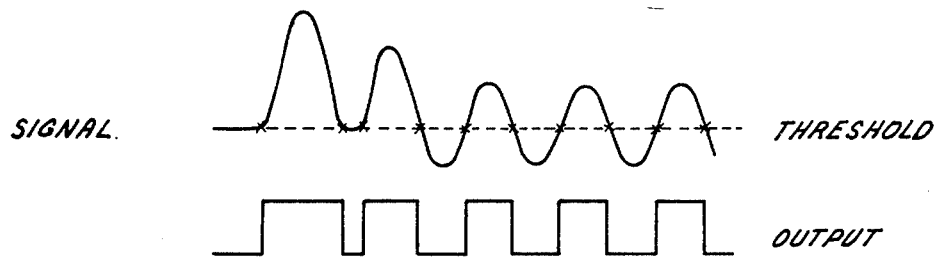
FIG. 2 shows the response of a simple ac coupled receiver.
Figure 3:
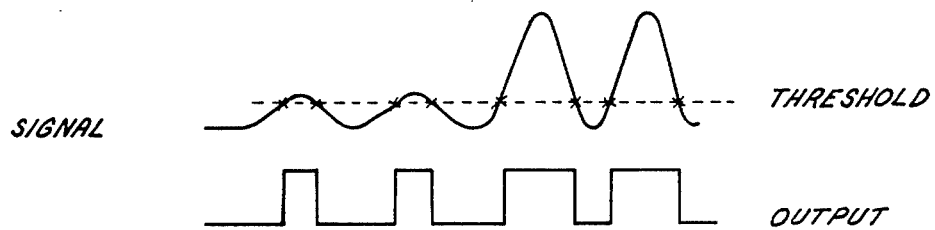
FIG. 3 shows the response of a typical dc coupled receiver.

In order to appreciate the benefits of the present invention it would be helpful to examine the specific problems which are overcome by the invention. Conventional ac and dc coupled receivers cause distortion at higher bit rates. For purposes of explanation it is assumed that a plurality of optical signals of about 50 megabits/sec are received by the photodetector 21 and that as a result of these optical signals, the waveforms of FIGS. 2 and 3 are generated. The response of a simple ac coupled receiver is shown in FIG. 2 and the response of a dc coupled receiver is shown in FIG. 3. The ac coupled circuit causes distortion at the beginning of a message while the dc coupled circuit causes distortion dependent on the signal amplitude. In the receiver according to the present invention, a dc coupled amplifier is used but the distortion caused by variations in signal amplitude are removed by appropriate signal processing. The signal distortion which occurs in such a dc coupled circuit occurs in the receivers when the rise and fall times of the signal are slow and the comparator threshold in the data decision circuit is not up to approximately half the height of the leading edge (or trailing edge of the data waveform). Rise and fall times are usually slowed in the low pass filter circuit which removes out of band noise. It is therefore necessary to detect the data halfway up the leading and trailing edges in order to faithfully reproduce the transmitted width. This circuit achieves the desired result by providing separate comparators for the leading and trailing edges. Separately derived comparator thresholds are provided. The thresholds are derived from the data by delaying and dividing the data. Therefore the threshold is made to be optimum regardless of amplitude.

FIG. 4 shows the waveforms in the device shown in FIG. 5 according to the invention. The output of the amplifier (shown in FIG. 1) is supplied to terminal 71 to which a delay circuit 73 and a first input of a comparator 61 are connected. The output of the delay circuit is a replica of the output of the amplifier. This signal is supplied to the second input of comparator 61. The signal supplied to the first input of comparator 61 is divided by divider 67. As a result of this arrangement, the signals 101 and 100, respectively are supplied to the first and second inputs of comparator 61. During such time as signal 100 is of greater amplitude than signal 101, the output of comparator 61 is positive. Otherwise comparator 61 provides a zero output. As can be seen in FIG. 4, the trailing edge of output A does not accurately reflect the end (or half amplitude point) of signal 100. However, the leading edge of output signal A does correspond with the leading edge of signal 100.

The output of delay circuit 73 is connected to the input of delay circuit 75 and to the first input of comparator 62. The output of delay circuit 75 is connected through divider 68 to the second input of comparator 62. The signal 100 is the same as that shown with respect to comparator 61. The output of divider 68 is the signal 102 which, as can be seen, is delayed with respect to signal 100. The output signal B of comparator 62 is positive when signal 100 is greater than signal 102 and at all other times is zero. As shown in FIG. 4, the trailing edge of output signal B accurately corresponds with the trailing edge of signal 100.

By combining output signal A and output signal B in such a way as to retain the accurately timed leading edge of output A and the accurately timed trailing edge of output B the resulting signal (A.B) wil faithfully correspond with the high bit rate input signal. By the use of an AND circuit 51 the desired output (A.B) is obtained.

In practice, an offset is required to be added to the thresholds 101, 102 to insure that the circuit does not respond to noise. For best results, this offset is not added to the threshold directly, but is instead added through a diode to define a lower limit to the threshold. Such an arrangement does not distort the threshold at high amplitude levels. The circuitry utilized may be any suitable bias circuit which does not interfere with the operation of the comparators. A typical bias circuit is illustrated in FIG. 5 where, for purposes of simplicity, only one comparator 62 is shown to have its input biased although in practice it would be desirable to produce a bias, or offset, to the threshold inputs of both comparators 61, 62. A dc voltage source 82 is provided to supply an offset voltage through diode 83.

The present invention will find particular application in high speed fiber optic data buses. The invention may also be useful in receivers operating at lower speeds and in point to point data links. While the above described invention has been described with respect to particular apparatus, it is to be understood that this description is provided for purposes of illustration only, and is not intended to limit the scope of the invention as described in the accompanying claims.

I claim:

1. An optical receiver comprising:
   means for detecting optical signals and generating an electrical output in response to said optical signals,
   first and second signal delay means each having an input and an output,
   first and second voltage comparator means each having an inverting and a noninverting input,
   first and second voltage divider means connected to the inverting inputs of said first and second voltage comparator means respectively,
   said electrical output generating means connected to the input of said first signal delay means and to said first voltage divider means,
   the output of said first signal delay means connected to the noninverting inputs of said first and second voltage comparator means and to the input of said second signal delay means,
   the output of said second signal delay means connected to said second voltage divider means, and
   means for multiplying the logic valves of the outputs of said comparators.

2. An optical receiver comprising:
   means for generating an electrical output signal in response to an optical input,
   threshold means including means for deriving from said electrical output signal two replica signals which are phase-shifted relative to one another and to said electrical output signal, and means for converting two of said signals into respective thresholds, and
   output shaping means including means for individually comparing the remaining signal with each of said thresholds and for generating respective comparison signals having values representative of two logic states in dependence on the results of said comparisons, and means for issuing an outgoing signal only when both of said comparison signals are simultaneously at the value representative of one of said logic states.

3. An optical receiver as claimed in claim 2 wherein said threshold means comprises
   first and second delay means each having an input terminal and an output terminal, the output of said first delay means being connected to the input of said second delay means, and wherein said comparing means includes first and second voltage comparators each having a first input and a second input, one of said inputs being inverting and the other non-inverting, the output of said second delay means being connected to said first input of said second voltage comparator, the input of said first delay means being connected to said first input of said first voltage comparator and the output of said first delay means being connected to said second inputs of said first and second voltage comparators.

4. An optical receiver as claimed in claim 3 wherein said issuing means comprises:
   an AND gate having first and second inputs, said first input being connected to the output of said first voltage comparator and said second input being connected to the output of said second voltage comparator.

5. An optical receiver as claimed in claim 3, wherein said converting means includes
   first voltage dividing means for reducing the voltage supplied to said second input of said first voltage comparator, and
   second voltage dividing means for reducing the voltage supplied to said second input of said second voltage comparator.

* * * * *